US011328900B2

(12) United States Patent
Pratt et al.

(10) Patent No.: US 11,328,900 B2
(45) Date of Patent: May 10, 2022

(54) PLASMA IGNITION CIRCUIT (71) Applicant: Applied Materials, Inc., Santa Clara, CA (US)

(72) Inventors: Teryl Pratt, Santa Clara, CA (US); Rongping Wang, Cupertino, CA (US); Guomin Mao, San Jose, CA (US); Andy Chuang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 249 days.

(21) Appl. No.: 16/792,562

(22) Filed: Feb. 17, 2020

(65) Prior Publication Data
US 2020/0294769 A1   Sep. 17, 2020

Related U.S. Application Data (60) Provisional application No. 62/817,833, filed on Mar. 13, 2019.

(51) Int. Cl.
*H01J 37/32* (2006.01)
*H05H 1/36* (2006.01)

(52) U.S. Cl.
CPC ......... *H01J 37/32091* (2013.01); *H05H 1/36* (2013.01)

(58) Field of Classification Search
CPC ........... H01J 37/32091; H01J 37/32082; H01J 37/32183
See application file for complete search history.

(56) References Cited

U.S. PATENT DOCUMENTS

| 2004/0160190 | A1  |    | 8/2004  | Gonzalez et al. |              |
|--------------|-----|----|---------|-----------------|--------------|
| 2014/0346952 | A1  | *  | 11/2014 | Choi ............ | H01J 37/3299 |
|              |     |    |         |                 | 315/111.51   |
| 2015/0250046 | A1  |    | 9/2015  | Habu            |              |
| 2016/0343546 | A1  |    | 11/2016 | Kishinevsky     |              |
| 2017/0330764 | A1  |    | 11/2017 | Lai et al.      |              |
| 2018/0247791 | A1  | *  | 8/2018  | Sung .......... | H01J 37/32862 |
| 2018/0247794 | A1  | *  | 8/2018  | Sung .......... | H01J 37/32183 |
| 2019/0066979 | A1  | *  | 2/2019  | Shoeb ......... | H01J 37/32183 |
| 2019/0089135 | A1  | *  | 3/2019  | Gupta ......... | H01J 37/32357 |

FOREIGN PATENT DOCUMENTS

JP   2013122966 A   6/2013

OTHER PUBLICATIONS

PCT/US2020/018363, International Search Report and Written Opinion dated Jun. 11, 2020, 8 pages.

* cited by examiner

*Primary Examiner* — Binh X Tran
(74) *Attorney, Agent, or Firm* — Patterson + Sheridan, LLP (57) ABSTRACT A plasma ignition circuit includes a transformer having a primary coil configured to couple an RF power supply. A first secondary coil is configured to couple a remote plasma source (RPS), and a second secondary coil. The plasma ignition circuit further includes a control switch having an input configured to couple the second secondary coil and an output configured to capacitively couple the RPS and a switch controller. The switch controller is configured to upon sensing a secondary RF voltage applied to the second secondary coil in response to an RF voltage applied by RF power supply to the primary coil, enable the control switch to capacitively apply the secondary RF voltage to the RPS to ignite a plasma within the RPS. Upon sensing a drop in plasma impedance when the plasma is ignited, disable the control switch to discontinue applying the secondary RF voltage to the RPS.

20 Claims, 11 Drawing Sheets

PLASMA IGNITION CIRCUIT

CROSS-REFERENCE TO RELATED APPLICATIONS

This application claims benefit of U.S. provisional patent application Ser. No. 62/817,833, filed Mar. 13, 2019, which is herein incorporated by reference.

BACKGROUND

Field

Examples of the present disclosure generally relate to an inductively-coupled remote plasma source (RPS) for a processing chamber, and more particularly, to a plasma ignition circuit for igniting a plasma from processing gases circulated in the processing chamber using the RPS.

Description of the Related Art

Plasma processing chambers are regularly utilized in various electronic device fabrication processes, such as etching processes, chemical vapor deposition (CVD) processes, and other processes related to the manufacture of electronic devices on substrates. Many ways have been employed to generate and/or control the plasma density, shape, and electrical characteristics in processing chambers, such as capacitively or inductively coupled RF sources commonly used in conventional plasma chambers. For example, during a plasma-enhanced chemical vapor deposition (PECVD) process, process gases are introduced into a processing chamber through a capacitively coupled showerhead that is disposed over a semiconductor substrate that is circumscribed by a process kit. Once a plasma is formed in a PECVD chamber, the plasma and process gas(es) interact with the substrate to deposit a desired material layer thereon.

Conventional plasma processing chamber designs in which the generated plasma is disposed over the substrate surface can cause unwanted sputtering and damage to the substrate surface due to the interaction of electrons and ions formed in the plasma with the substrate surface. Floating and electrically grounded components that are exposed to the generated plasma will generally accumulate a net charge. The formed net charge causes electrons and/or ions formed in the plasma to bombard and possibly damage the exposed surfaces of the substrate or chamber component.

Therefore, to prevent or minimize the plasma interaction with the substrate and chamber components, remote plasma sources (RPS) have been developed. A typical remote plasma source includes a plasma generation region that is remotely positioned from the processing region of the processing chamber in which a substrate is positioned. In this way the plasma generated in the plasma generation region of the RPS will generally not interact with the substrate surface.

However, conventional remote plasma sources typically utilize microwave, capacitively coupled, or inductively coupled energy sources that have a narrow plasma generating region, which causes these devices to have a smaller than desirable plasma processing window that limits the range of energies of the formed gas radicals and gas ion that are formed in the plasma generating region of the conventional RPS. Conventional remote plasma sources are generally not able to tune power delivered to the plasma without also altering other process conditions, and undesirably may employ ignition voltages that are large enough to cause arcing within the chamber.

Therefore, there is a need for an improved remote plasma source and ignition circuit for the same.

SUMMARY

In one example, a plasma ignition circuit is disclosed. The plasma ignition circuit includes a transformer having a primary coil configured to couple an RF power supply. A first secondary coil is configured to couple a remote plasma source (RPS), and a second secondary coil. The plasma ignition circuit further includes a control switch having an input configured to couple the second secondary coil and an output configured to capacitively couple the RPS and a switch controller. The switch controller is configured to, upon sensing a secondary RF voltage applied to the second secondary coil in response to an RF voltage applied by RF power supply to the primary coil, enable the control switch to capacitively apply the secondary RF voltage to the RPS to ignite a plasma within the RPS. The switch controller is further configured to, upon sensing a drop in plasma impedance when the plasma is ignited, disable the control switch to discontinue applying the secondary RF voltage to the RPS.

In another example, a processing chamber is disclosed. The processing chamber has a chamber body having an internal volume. The processing chamber further includes a remote plasma source (RPS) having an inlet and an outlet, the outlet fluidly coupled to the internal volume of the chamber body. The processing chamber further includes a plasma ignition circuit coupled to the RPS. The plasma ignition circuit includes a transformer having a primary coil configured to couple an RF power supply. A first secondary coil is configured to couple a remote plasma source (RPS), and a second secondary coil. The plasma ignition circuit further includes a control switch having an input configured to couple the second secondary coil and an output configured to capacitively couple the RPS and a switch controller. The switch controller is configured to upon sensing a secondary RF voltage applied to the second secondary coil in response to an RF voltage applied by RF power supply to the primary coil, enable the control switch to capacitively apply the secondary RF voltage to the RPS to ignite a plasma within the RPS. The switch controller is further configured to, upon sensing a drop in plasma impedance when the plasma is ignited, disable the control switch to discontinue applying the secondary RF voltage to the RPS.

In yet another example, a plasma ignition circuit is disclosed. The plasma ignition circuit includes a primary RF power supply having a primary RF output voltage configured to be inductively couple to a remote plasma source (RPS). The plasma ignition circuit includes an RF generator having an output configured to couple the RPS. The plasma ignition circuit further includes an RF source control circuit having an input and an output, the input of the RF source control circuit coupled to the primary RF power supply, the output of the RF source control circuit coupled to the RF generator. The RF source control circuit is configured to, upon sensing the primary RF output voltage exceeding a threshold voltage, enable the RF generator to apply an ignition pulse to the RPS to ignite a plasma within the RPS. The RF source control circuit is further configured to, upon sensing a drop in plasma impedance when the plasma is ignited, disable the RF generator to discontinue applying the ignition pulse to the RPS.

In yet another example, a plasma ignition circuit is disclosed. The plasma ignition circuit includes a transformer having a primary coil configured to couple a primary RF power supply, a first secondary coil configured to couple a remote plasma source (RPS), and a second secondary coil. The plasma ignition circuit further includes an RF generator having an input and an output configured to couple the RPS. The plasma ignition circuit further includes an RF source control circuit having an input and an output, the input of the RF source control circuit coupled to the second secondary coil, the output of the RF source control circuit coupled to the RF generator. The RF source control circuit is configured to, upon sensing a secondary RF voltage applied to the second secondary coil in response to an RF voltage applied by RF power supply to the primary coil exceeding a threshold voltage value, enable the RF generator to apply an ignition pulse to the RPS to ignite a plasma within the RPS. The RF source control circuit is further configured to, upon sensing the secondary RF voltage applied to the second secondary coil in response to an RF voltage applied by RF power supply to the primary coil falling below the threshold voltage value corresponding to a drop in plasma impedance when the plasma is ignited, disable the RF generator to discontinue applying the ignition pulse to the RPS.

In yet another example, a method for igniting a plasma within a remote plasma source (RPS) is disclosed. The method includes applying an RF voltage supplied by an RF power supply to the primary coil of a transformer. The method further includes supplying, by the transformer, a secondary RF voltage to the RPS and to an input of a switch controller. The method further includes sensing, by the switch controller, the secondary RF voltage applied to the RPS. The method further includes, in response to sensing the secondary RF voltage, enabling, by the switch controller, a control switch to capacitively apply the RPS voltage to the RPS to ignite a plasma within the RPS. The method further includes, in response to sensing, by the switch controller, a drop in plasma impedance when the plasma is ignited, disabling, by the switch controller, the control switch to discontinue applying the secondary RF voltage to the RPS.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A high voltage plasma ignition circuit configured to ignite a plasma in a remote plasma source (RPS) fluidly coupled to an internal volume of a processing chamber is disclosed. The plasma ignition circuit provides consistent and reliable plasma ignition, and fast detection of plasma formation. Once the plasma is ignited, the plasma ignition circuit detects a drop in a value of impedance of the plasma, which turns the plasma ignition circuit off quickly and automatically.

Consistent plasma ignition provided by the ignition circuit provides improved process reliability and performance. The plasma ignition circuit avoids unnecessary applied voltage overshoot and long duration of applied high voltage. The plasma ignition circuit ignites the plasma consistently and avoids applying high voltage for an extended period of time. Thus, the ignition circuit improves chamber performance and prevents chamber arcing.

Figure 1:
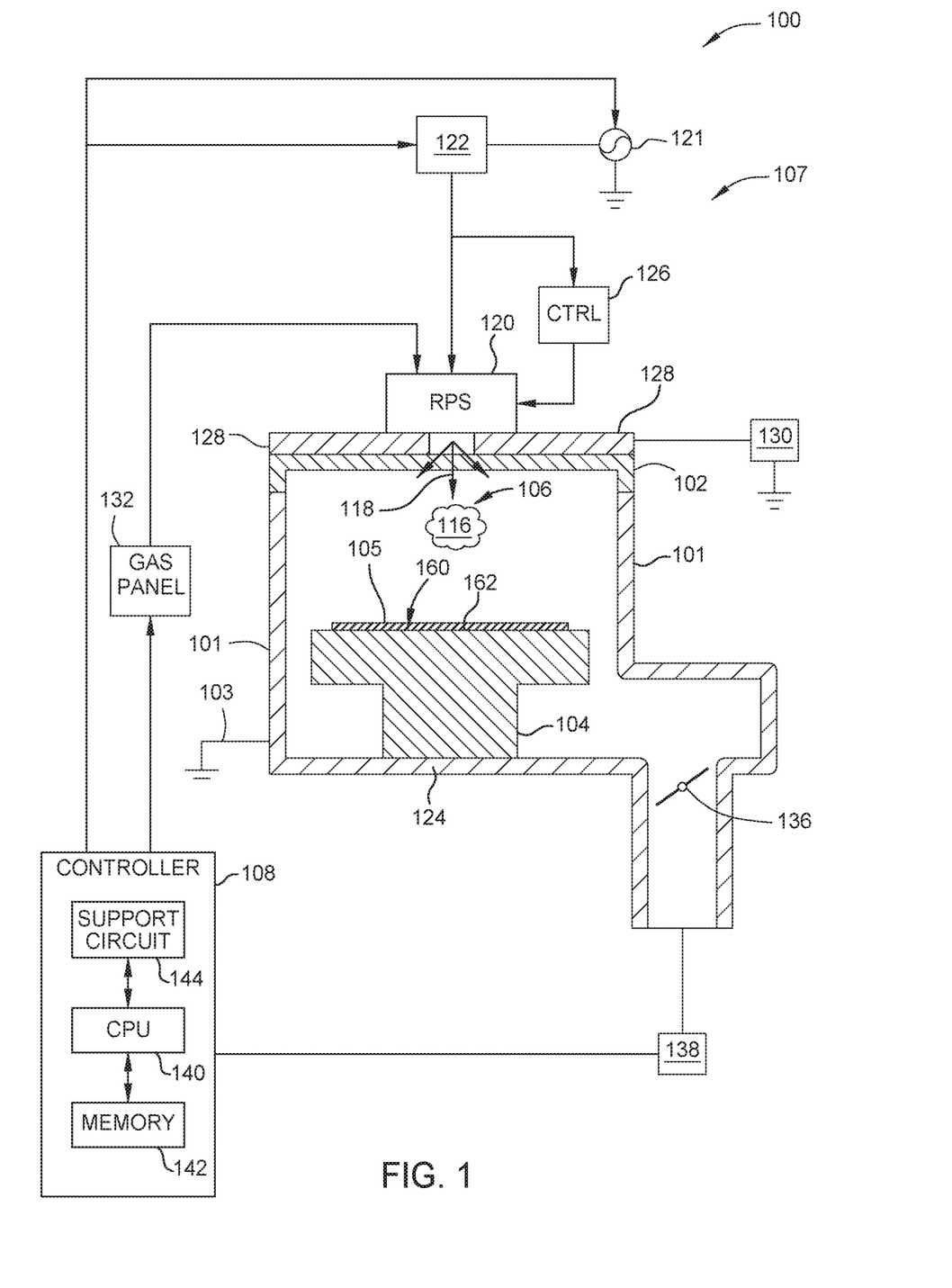
FIG. 1 is a schematic sectional view of a processing chamber according to one embodiment of the disclosure.

FIG. 1 is a schematic cross-sectional view of a processing chamber 100 configured to perform a plasma process within a processing volume 106 of the processing chamber 100 by use of a source assembly 107, according to one embodiment. In this embodiment, the processing chamber 100 is a plasma processing chamber, such as a reactive ion etch (RIE) plasma chamber. In some other embodiments, the processing chamber is a plasma-enhanced deposition chamber, for example a plasma-enhanced chemical vapor deposition (PECVD) chamber, a plasma enhanced physical vapor deposition (PEPVD) chamber, or a plasma-enhanced atomic layer deposition (PEALD) chamber. In some other embodiments, the processing chamber is a plasma treatment chamber, or a plasma based ion implant chamber, for example a plasma doping (PLAD) chamber. Herein, the processing chamber 100 includes the source assembly 107 that includes an inductively coupled remote plasma source (RPS) 120 electrically coupled to a radio frequency (RF) power supply121 through matching circuit 122.

The processing chamber 100 includes a chamber body 102 which includes a chamber lid 128, one or more sidewalls 101, and a chamber base 124 which define a processing volume 106. The chamber body 102 is typically coupled to an electrical ground 103. A gas panel 132 is configured to deliver one or more processing gases to the RPS 120. A plasma ignition circuit 126 is inductively coupled to the RF power supply 121 through a matching circuit 122 that is also inductively coupled to the RPS 120. In one embodiment, the RF power supply 121 operates at 2000V having a frequency between 400 kHz to 600 kHz and having an operating current in the range of 20 Amps to 40 Amps. The plasma ignition circuit 126 is configured to provide a short duration pulse of RF power originating from the RF power supply 121 to ignite the one or more processing gases into a plasma 116 in the RPS 120. The disassociated species in the plasma 116 flows through the RPS 120 through a gas inlet 118 disposed through the chamber lid 128 and into the processing volume 106 in fluid communication therewith.

The processing volume 106 is fluidly coupled to one or more dedicated vacuum pumps, through a vacuum outlet 138 under the control of a valve 136, which maintain the processing volume 106 at sub-atmospheric conditions and evacuate processing, and/or other gases, therefrom. A substrate support 160, disposed in the processing volume 106, is disposed on a support shaft 104 sealingly extending through the chamber base 124.

A substrate 105 is loaded into, and removed from, the processing volume 106 through an opening (not shown) in one of the one or more sidewalls 101, which is sealed with a door or a valve (not shown) during plasma processing of the substrate 105. The substrate 105 is disposed on a receiving surface 162 of the substrate support 160 during processing.

The processing chamber 100 further includes a system controller 108. The system controller 108 herein includes a central processing unit (CPU) 140, a memory 142, and support circuits 144 for the CPU 140 and facilitates control of the components of the processing chamber 100. The CPU 140 is a general purpose computer processor configured for use in an industrial setting for controlling processing chamber and sub-processors related thereto.

The memory 142 described herein may include random access memory, read only memory, floppy or hard disk drive, or other suitable forms of digital storage, local or remote. The support circuits 144 are conventionally coupled to the CPU 140 and comprise cache, clock circuits, input/output subsystems, power supplies, and the like, and combinations thereof. Software instructions and data can be coded and stored within the memory 142 for instructing a processor within the CPU 140. A program (or computer instructions) readable by the system controller 108 determines which tasks are performable by the components in the processing chamber 100. Preferably, the program, which is readable by the system controller 108, includes code, which when executed by the processor, perform tasks relating to the monitoring and operation of the RF power supply 121, the gas panel 132, and the vacuum outlet 138 under the control of the valve 136.

Figure 2:
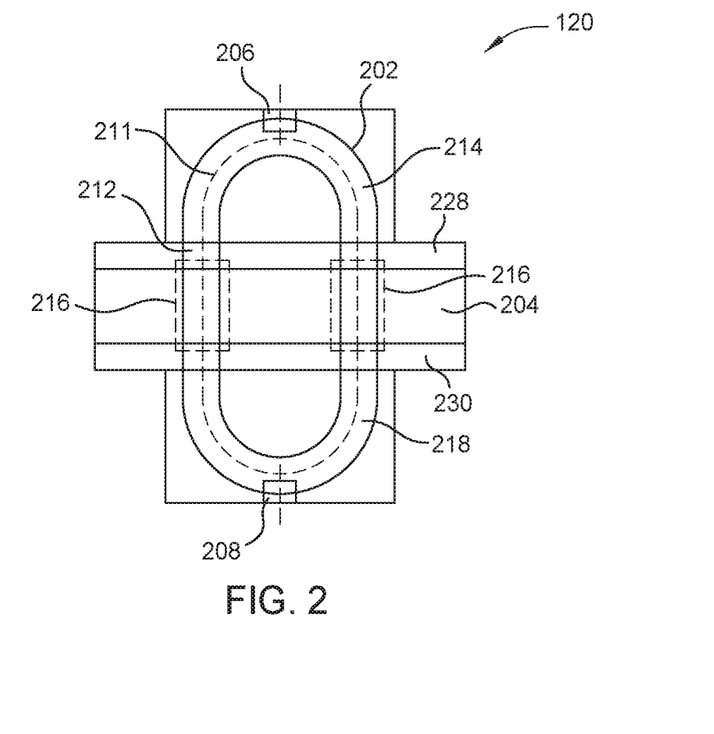
FIG. 2 is a schematic cross-sectional view of a remote plasma source (RPS).

FIG. 2 is a schematic cross-sectional view of the RPS 120. The RPS 120 includes a hollow gas conduit 202 and a ferrite core element 204. The gas conduit 202 has sections made of a conductive material, such as aluminum. The gas conduit 202 has an input port 206, an output port 208, and two branch channels 212, 214. The gas conduit 202 further has upper sections 211, central sections 216, and lower sections 218. The input port 206 is configured to receive one or more gases flowed from the gas panel 132 to be ignited into the plasma 116 within the gas conduit 202. The gas conduit 202 is configured to split the flow of the one or more gases to either branch channel 212, 214 of the gas conduit 202. The plasma ignition circuit 126 is configured to form the plasma 116 from the one or more gases to either branch channel 212, 214 of the gas conduit 202 to ionize the one or more gases into a plasma 116. The gas conduit 202 is configured to recombine the flow of the ionized one or more gases from either branch channel 212, 214 of the gas conduit 202. The recombined plasma 116 is configured to flow out of the output port 208 of the gas conduit 202 into the processing chamber 100.

Each branch channel 212, 214 of the gas conduit 202 has a pair of insulative spacers 228, 230 separating the central sections 216 from the upper sections 211 and the lower sections 218 of the gas conduit 202. As a result, the central sections 216 are electrically isolated from the upper sections 211 and the lower sections 218. The electrically isolated central sections 216 serve as contact points for the application of the plasma ignition circuit 126.

The insulative spacers 228, 230 are further disposed on an upper side and a lower side of the core element 204 to further isolate the core element 204 from the central sections 216 of the gas conduit 202. Isolation of the core element 204 from the gas conduit 202 prevents eddy currents from forming in the core element 204 to partially cancel electric and magnetic fields that contribute to the operation of the RPS 120.

Figure 3A:
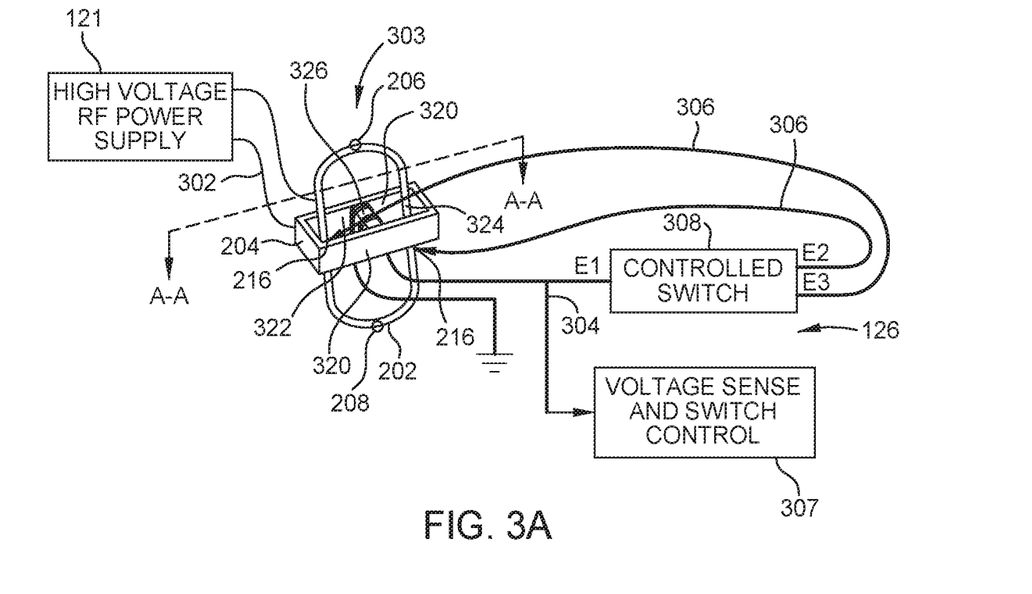
FIG. 3A is a schematic diagram of the RPS of FIG. 2.
Figure 3B:
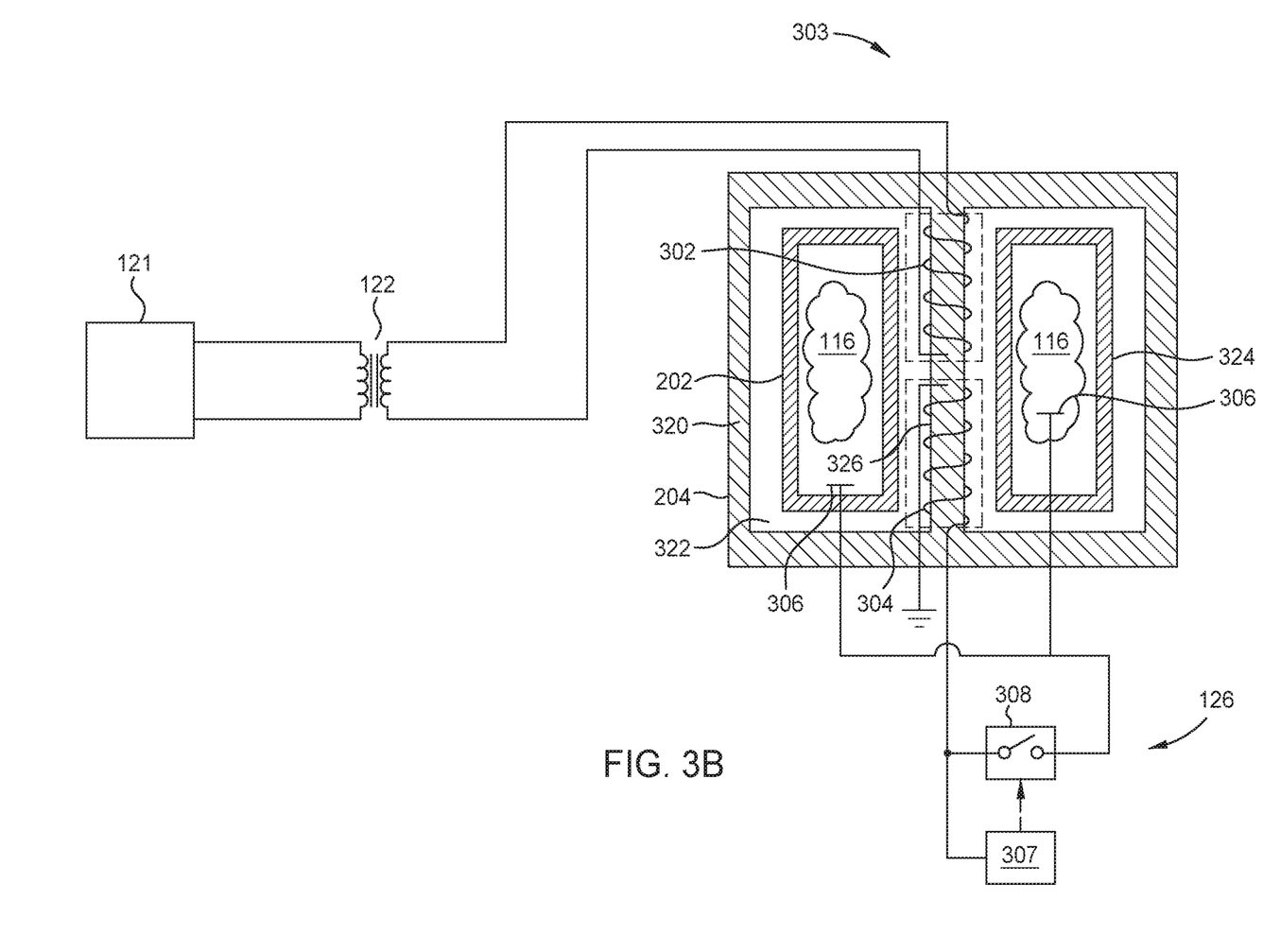
FIG. 3B show a sectional view of the RPS illustrated in FIG. 3A taken along the line A-A of FIG. 3A.

FIG. 3A is a schematic diagram of the RPS 120 of FIG. 2. FIG. 3B show a sectional view of the RPS 120 illustrated in FIG. 3A taken along the line A-A of FIG. 3A. FIGS. 3A and 3B show the connection of the core element 204 to the RF power supply 121, the gas conduit 202, and to the plasma ignition circuit 126. The plasma ignition circuit 126 includes a switch controller 307 configured to enable and disable a control switch 308. The plasma ignition circuit 126 has an input terminal (labeled E1) coupled to both the switch controller 307 and the control switch 308. The plasma ignition circuit 126 has a pair of output terminals (labeled E2, E3) configured, when the control switch 308 is enabled by the switch controller 307, to apply a controlled pulse of RF voltage to the central sections 216 of the gas conduit 202 to ignite the plasma 116.

The core element 204 has a body 320 having a first aperture 322 and a second aperture 324 separated by a central section 326 of the body 320. The gas conduit 202 extends through the apertures 322, 324.

Sets of windings 302, 304 and the gas conduit 202 are connected to the core element 204 to form an excitation RF transformer 303. The RF power supply 121 is connected to a first plurality of windings 302 that are wound about the central section 326 of the body 320 of the core element 204 to form a primary coil 402 (See FIG. 4) of the excitation RF transformer 303. In one example, the first plurality of windings 302 has two turns. The gas conduit 202 extends through the apertures 322, 324 of the body 320 of the core element 204 to form a first secondary coil 404 (See FIG. 4) of the excitation RF transformer 303. The gas conduit 202 is equivalent to a single turn driving one or more capacitors (not shown).

The plasma ignition circuit 126 connects a second plurality of windings 304 extending from the input E1 and wound about the central section 326 of the body 220 of the core element 204 for a second secondary coil 406 (See FIG. 4) of the excitation RF transformer 303. One end of the second secondary coil 406 is connected to ground potential. A pair of conductors 306 extend from the outputs E2, E3 of the plasma ignition circuit 126 to the central sections 216 of the gas conduit 202 configured to ignite the plasma 116.

Figure 4:
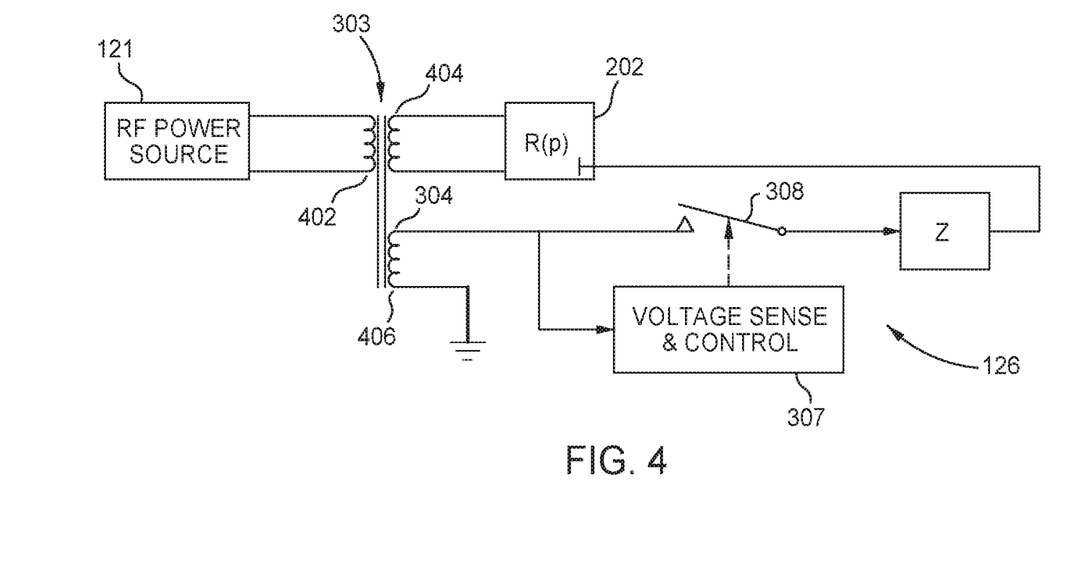
FIG. 4 is an equivalent electrical schematic circuit diagram corresponding to the RPS of FIGS. 3A and 3B.

FIG. 4 is an equivalent electrical schematic circuit diagram corresponding to the RPS 120 of FIGS. 3A and 3B. FIG. 4 shows the connections between the RF power supply 121, the gas conduit 202, and the plasma ignition circuit 126 to the excitation RF transformer 303. The RF power supply 121 is coupled to the primary coil 402 of the excitation RF transformer 303. The gas conduit 202 is inductively coupled to the first secondary coil 404 of the excitation RF transformer 303. R(p) represents an impedance of gases flowing within the gas conduit 202. Before ignition into the plasma 116, the gases have a substantially infinite impedance R(p). The impedance R(p) drops to a lower value when the gases are ionized into the plasma 116. The second secondary coil 406 is coupled to ground potential and to the switch controller 307 and one terminal of the control switch 308 of the plasma ignition circuit 126. The impedance Z provides a current limiter function when the control switch 308 is closed.

Figure 5A:
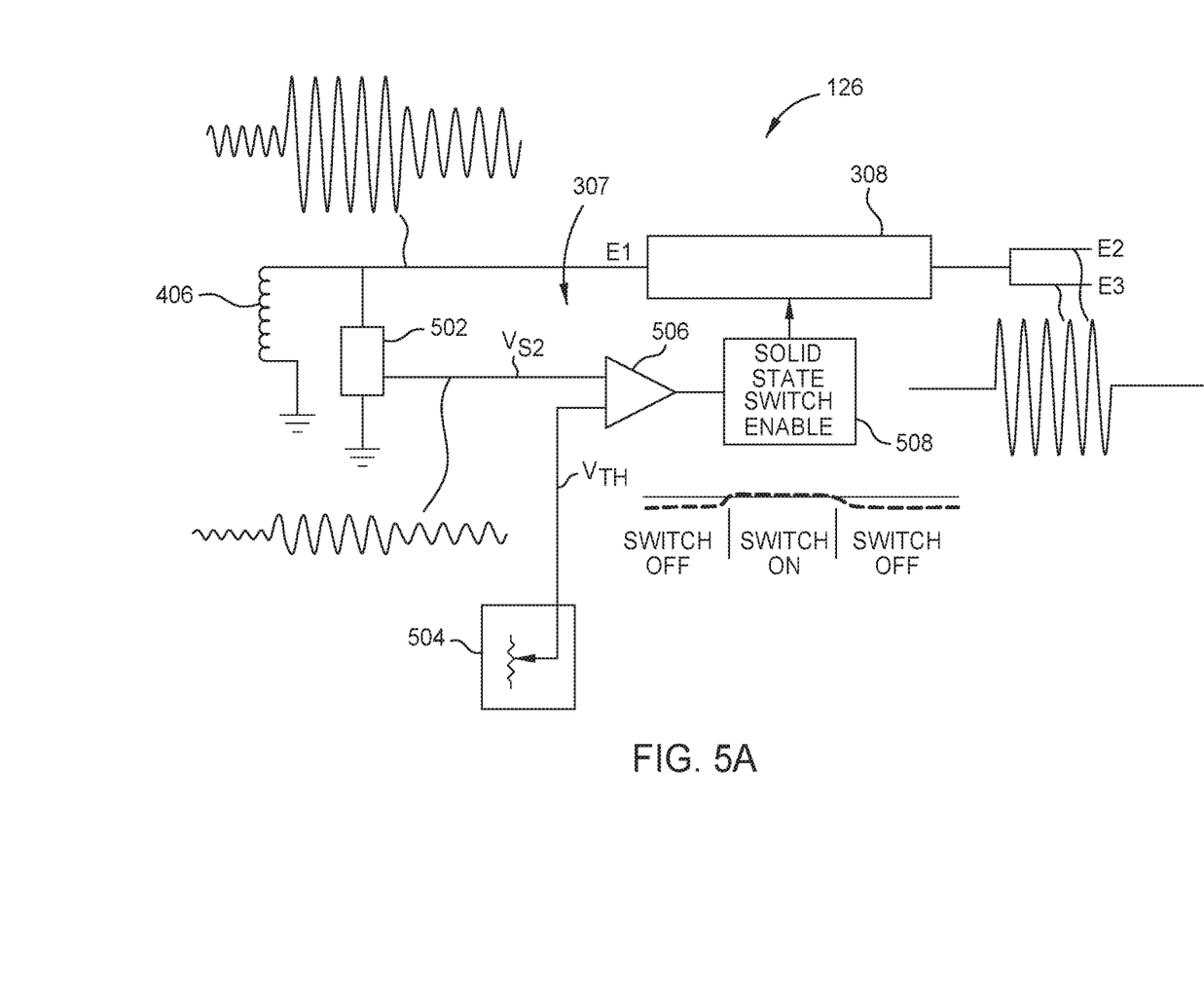
FIG. 5A is an electrical circuit diagram corresponding to a switch controller and a control switch of a plasma ignition circuit.

FIG. 5A is an electrical circuit diagram corresponding to the switch controller 307 and the control switch 308 of the plasma ignition circuit 126. In an embodiment, the control switch 308 is a solid state switch. In one embodiment, the solid state switch is one or more of insulated-gate bipolar transistors (IGBT). The switch controller 307 comprises a voltage divider 502, a threshold level circuit 504, a comparator 506, and a switch enable circuit 508, connected as shown. The voltage divider 502 is configured to sense a second secondary RF voltage applied to the second secondary coil 406 in response to the RF voltage applied by RF power supply 121 to the primary coil 402. The voltage divider 502 is configured to divide the second secondary RF voltage received from the second secondary coil 406 down to a reduced voltage VS2. The threshold level circuit 504 is configured to output a threshold voltage VTH indicative of a voltage level needed to ignite the plasma. The comparator 506 is configured to compare the reduced voltage VS2 to the threshold level voltage VTH. When the reduced voltage VS2 exceeds the threshold voltage VTH, then the output of the comparator 506 switches from a first state to a second state. Conversely, if the reduced voltage VS2 subsequently falls below the threshold voltage, the output of the comparator 506 switches from the second state to the first state. The switch enable circuit 508 is coupled to the output of the comparator 506. The switch enable circuit 508 is configured to enable (close) the control switch 308 (control switch) when the reduced voltage VS2 exceeds the threshold voltage VTH as indicated by the comparator 506 changing state from the first state to the second state. The switch enable circuit 508 is configured to disable (open) the control switch 308 (control switch) when the reduced voltage VS2 falls below the threshold voltage VTH as indicated by the comparator 506 changing state from the second state to the first state.

Figure 5B:
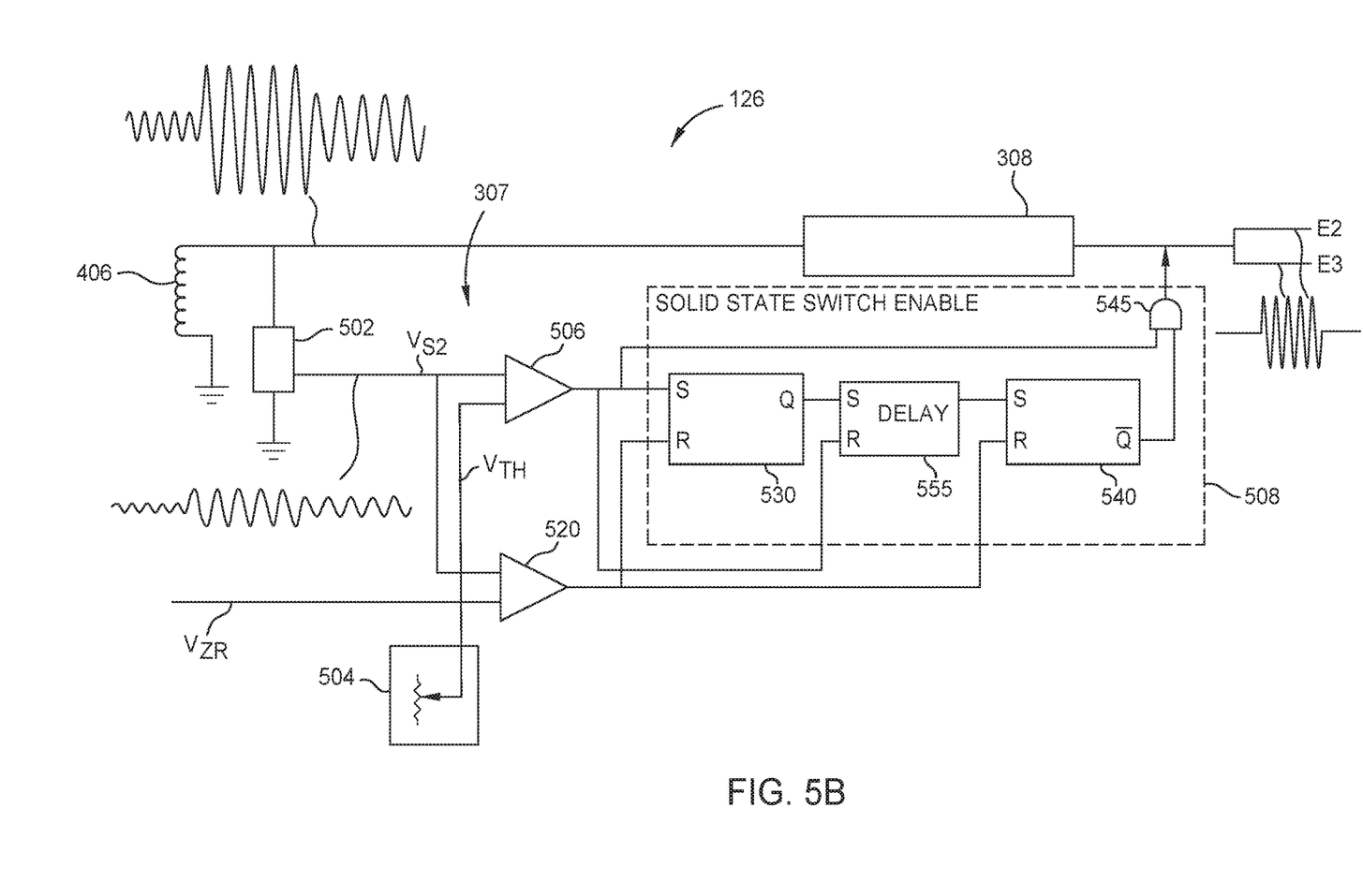
FIG. 5B is an alternate embodiment of an electrical circuit diagram corresponding to a switch controller and a control switch of a plasma ignition circuit.

FIG. 5B depicts an alternate embodiment of electrical circuit diagram corresponding to the switch controller 307 and the control switch 308 of the plasma ignition circuit 126. In an embodiment, the control switch 308 is a solid state switch. In one embodiment, the solid state switch is one or more of insulated-gate bipolar transistors (IGBT). The switch controller 307 comprises a voltage divider 502, a threshold level circuit 504, a comparator 506, a second comparator 520, and a switch enable circuit 508, connected as shown. The voltage divider 502 is configured to sense a second secondary RF voltage applied to the second secondary coil 406 in response to the RF voltage applied by RF power supply 121 to the primary coil 402. The voltage divider 502 is configured to divide the second secondary RF voltage received from the second secondary coil 406 down to a reduced voltage VS2. The threshold level circuit 504 is configured to output a threshold voltage VTH indicative of a voltage level needed to ignite the plasma. The comparator 506 is configured to compare the reduced voltage VS2 to the threshold level voltage VTH. When the reduced voltage VS2 exceeds the threshold voltage VTH, then the output of the comparator 506 switches from a first state to a second state. Conversely, if the reduced voltage VS2 subsequently falls below the threshold voltage VTH, the output of the comparator 506 switches from the second state to the first state. The second comparator 520 is configured to compare the reduced voltage VS2 to a "zero" level voltage VZR, which in embodiments may be set to a value of 0.07 volts, or a different voltage based on the ignition voltage range requirements of a particular plasma device. When the reduced voltage VS2 exceeds the zero level voltage VZR, then the output of the second comparator 520 switches from a first state to a second state. If the reduced voltage VS2 subsequently falls below the zero voltage VZR, the output to the second comparator 520 switches from the second state to the first state. The switch enable circuit 508 comprises a first latch 530 in embodiments implemented as an R-S flip flop, a delay 555, a second latch 540 implemented as an R-S flip flop in embodiments, and an AND gate 545. The S gate of the first latch 530 is coupled to the output of the comparator 506 while the R gate of the first latch 530 is coupled to the output of the second comparator 520. The set output of the first latch 530 is additionally coupled to the AND gate 545. The set output of the first comparator 506 is coupled to delay 555, activating delay 555 when the first latch 530 is set. Upon receipt of the set signal from the first latch 530, delay 555 is initiated, the delay of which will last for 150 milliseconds in some embodiments, before transferring the signal to the S gate of the second latch 540. In some embodiments the delay may be as little as a few milliseconds to a few seconds, or other delay based on the ease, or difficulty, of igniting a plasma. Delay 555 is inhibited while VS2 is greater than VTH. This allows multiple ignition attempts as long as they are within 150 milliseconds of one another. Once the Delay 555 has timed out to 150 milli-seconds, it sets the second latch 540. Once both latches are set, the switch enable circuit 508 is disabled. In some embodiments delay 555 may be implemented by charging a capacitor through a resistor driven by the output of the first latch 530. The output of comparator 506 drives a transistor that shorts the capacitor to ground at any time that VS2 is greater than VTH. Once the capacitor has reached approximately 80% of full charge a separate comparator (not shown) provides the delay output that sets the second latch 540. The second latch 540 reset output is coupled to the AND gate 545. When the voltage threshold VTH is exceeded by the sense voltage VS2, the first latch 530 is set. When the voltage threshold VTH is exceeded by the sense voltage VS2, and the second latch 540 is not set (i.e. in its reset state), the switch enable circuit 508 is enabled. The switch enable circuit 508 is configured to enable (close) the control switch 308 when the reduced voltage VS2 exceeds the threshold voltage VTH as indicated by the comparator 506 changing state from the first state to the second state. The delay 535 is 150 milliseconds in embodiments. When the Delay 555 output has set the second latch 540, both the first latch 530 and second latch 540 are set, disabling the switch enable circuit 508 after the ignition phase. Using two latches as described allows the ignition circuit 126 to remain enabled during the ignition phase by the delay 555, and disabled after the ignition phase. The switch enable circuit 508 is configured to disable (open) the control switch 308 when the reduced voltage VS2 falls below the threshold voltage VTH as indicated by the comparator 506 changing state from the second state to the first state, and when the second comparator has changed to the set state, after the delay imposed by delay 555. Once the plasma is ignited, the ignition circuit 126 is no longer needed and disabled. Once VS2 is less than VZR, both the first latch 530 and second latch 540 are reset. This senses the removal of RF power and prepares the ignition circuit for operation the next time RF power is applied.

In operation, the RF power supply 121 is configured to apply a primary RF voltage to the primary coil 402. This causes the excitation RF transformer 303 to induce a first secondary RF voltage in the first secondary coil 404. The first secondary coil 404 applies the first secondary RF voltage applied to non-ionized gases within the gas conduit 202. The first secondary RF voltage is not large enough to ignite the plasma but large enough to maintain the plasma once it is ignited. Simultaneously, the primary RF voltage applied to the primary coil 402 causes the excitation RF transformer 303 to induce the second secondary RF voltage in the second secondary coil 406 which is applied to the plasma ignition circuit 126. The first secondary RF voltage and the second secondary RF voltage are in phase so that their waveforms are aligned and their amplitudes combine constructively. The second secondary RF voltage is applied to the voltage divider 502 to produce the reduced voltage VS2 that exceed the threshold voltage VTH, causing the comparator 506 to switch state and thus activate the switch enable circuit 508. The switch enable circuit 508 enables the control switch 308. The enabled control switch 308 applies the second secondary RF voltage to the central sections 216 of the gas conduit 202 while the first secondary RF voltage is also applied to the gas conduit 202. Since the first secondary RF voltage and the second secondary RF voltage reinforce each other, they combine into a combined RF voltage equal to the sum of the first secondary RF voltage and the second secondary RF voltage. The combined RF voltage is applied to the gases and is sufficiently large to ignite the plasma 116.

Once the plasma 116 is ignited, the impedance R(p) of the plasma 116 drops, thereby causing the combined RF voltage to drop to a lower value. This causes a drop in both the first secondary RF voltage amplitude and the second secondary RF voltage amplitude. The reduced amplitude of the first secondary RF voltage is applied to the voltage divider 502 to produce the reduced voltage VS2 that falls below the threshold voltage VTH, causing the comparator 506 to switch state again and thus deactivate the switch enable circuit 508. The switch enable circuit 508 disables the control switch 308. The disabling of the control switch 308 discontinues applying the second secondary voltage to the plasma 116. The plasma 116 continues to receive enough RF voltage from the first secondary coil to maintain the plasma 116.

Figure 6:
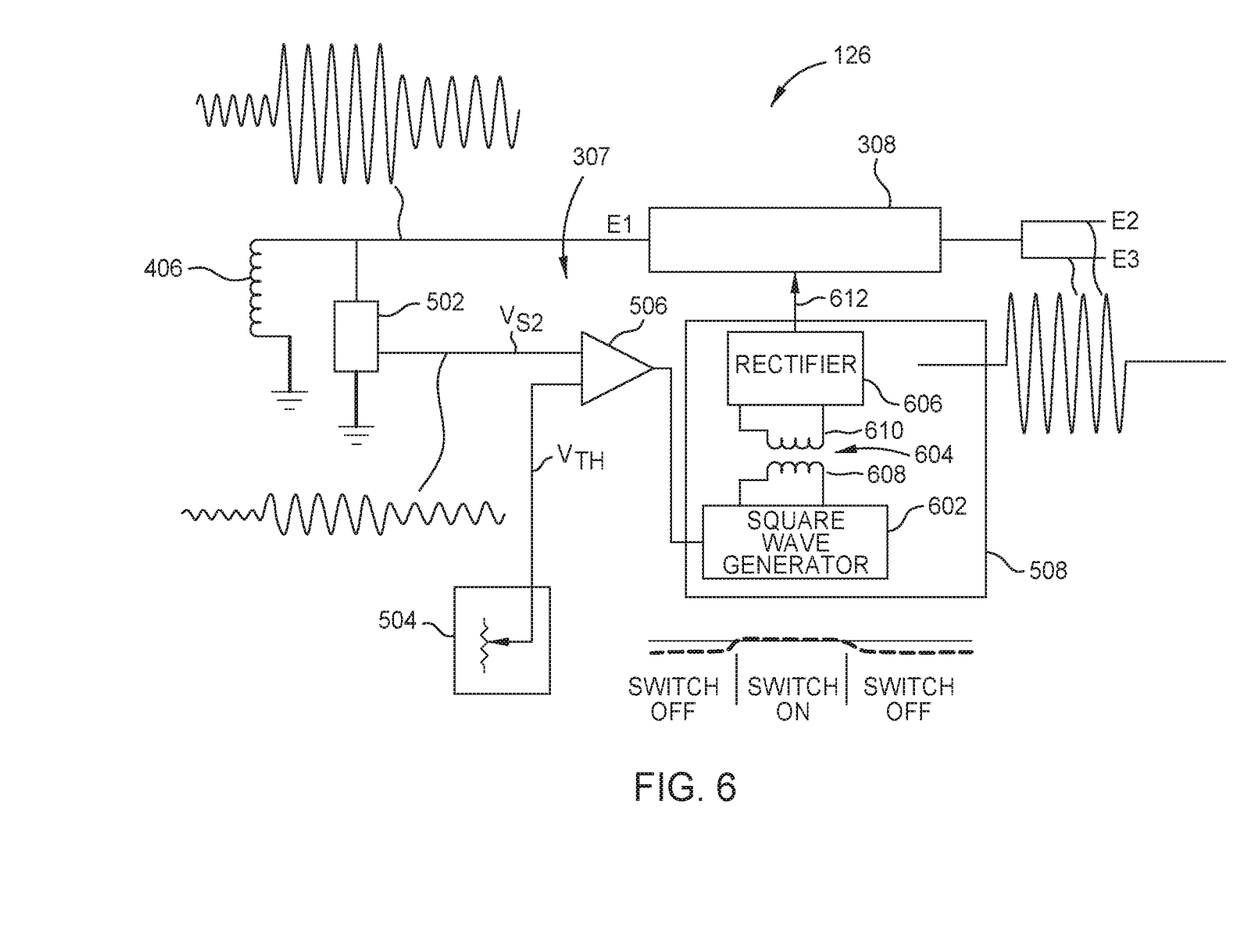
FIG. 6 is an electrical circuit diagram corresponding to a switch enable circuit of the plasma ignition circuit.

FIG. 6 is an electrical circuit diagram corresponding to the switch enable circuit 508. The switch enable circuit 508 comprises a voltage-controlled square wave generator 602, a transformer 604, and a rectifier 606, connected as shown. The voltage-controlled square wave generator 602 takes the output state of the comparator 506 for enabling or disabling the square wave generator 602. The square wave generator 602 is enabled when the comparator 506 switches from the first state to the second state as a result of the reduced voltage VS2 exceeding the threshold level voltage. Accordingly, the square wave generator 602 outputs a square wave to the transformer 604. The square wave generator 602 is disabled when the comparator 506 switches from the second state to the first state as a result of the reduced voltage VS2 falling below the threshold level voltage VTH. Accordingly, while the square wave generator 602 does not output a square wave to the transformer 604.

The transformer 604 has a primary coil 608 and a secondary coil 610. The primary coil 608 is coupled to an output of the square wave generator 602. The transformer 604 provides an isolated square wave to the rectifier 606. The rectifier 606 converting the square wave output by the square wave generator 602 to a DC voltage level and applies the DC voltage level to the control switch 308 to enable the control switch 308. In one embodiment, the control switch 308 has a gate terminal 612 configured to be coupled to an output of the rectifier 606 of the switch enable circuit 508 and configured to apply the rectified signal to the gate terminal 612.

Figure 7:
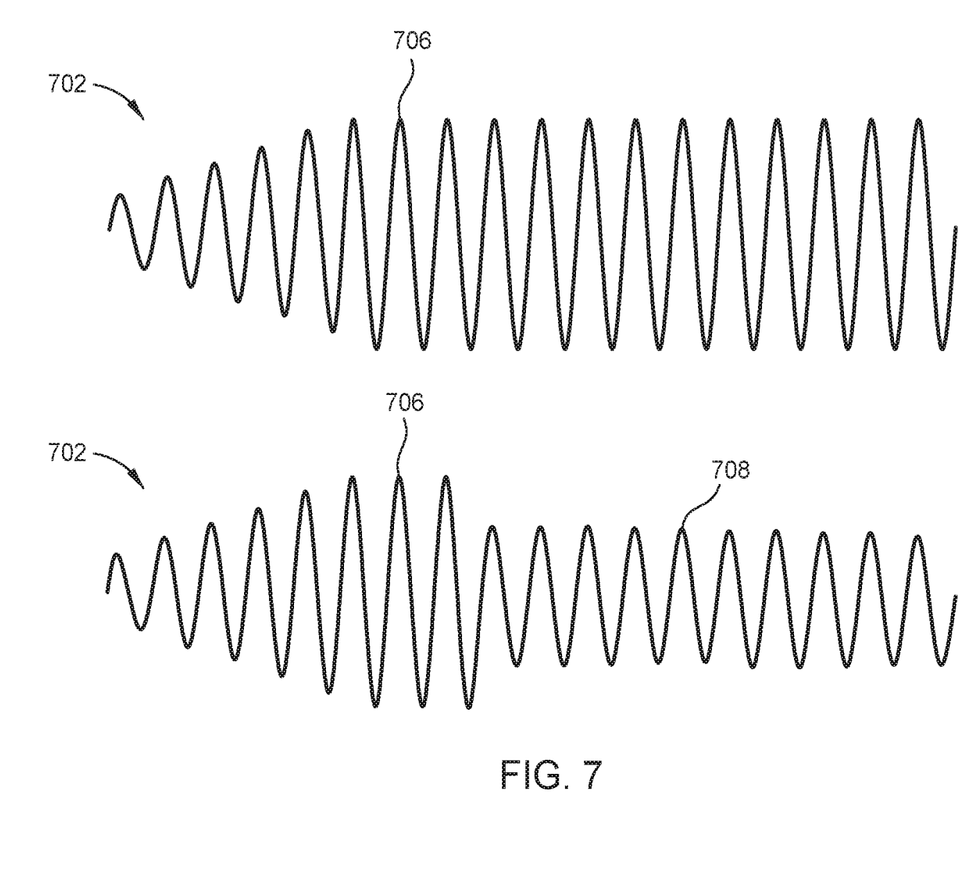
FIG. 7 is voltage waveforms of RF voltages applied to gases in a inductively coupled ignition apparatus.

FIG. 7 shows a first voltage waveform 702 of an RF voltage applied to the gases in a inductively coupled ignition apparatus when the impedance of the plasma 116 fails in a conventional inductively coupled ignition apparatus and a second voltage waveform 704 of an RF voltage applied to the gases of an embodiment of the present disclosure when ignition of the plasma 116 succeeds. Both waveforms 702, 704 have amplitudes that initially ramp up to a maximum amplitude 706 of the combined RF voltage of 2000V. When ignition fails, the amplitude remains the same. When ignition succeeds (once the plasma 116 is established), the amplitude 708 is reduced to about 600 V.

As the voltage ramps up to 1000 V or more on the primary coil 402, the voltage induced in the first secondary coil 404 and second secondary coil 406 winding is also about 1000V. Each isolated central section 216 of the gas conduit 202 can exhibit a capacitance to ground of around 150*pf*, (two 75*pf* capacitors in parallel). The capacitances divide the voltage to 670V which provides a much larger E field across the central section 216 of the gas conduit 202. This is sufficient to ignite Argon plasma even when the plasma tube has been contaminated.

Testing has shown that ignition occurs within 400 microseconds of application of this voltage. Inductive ignition can apply high voltages for several seconds and when plasma tube is contaminated may fail continually. Arcing should be substantially reduced as a consequence of the short plasma ignition cycle.

Figure 8:
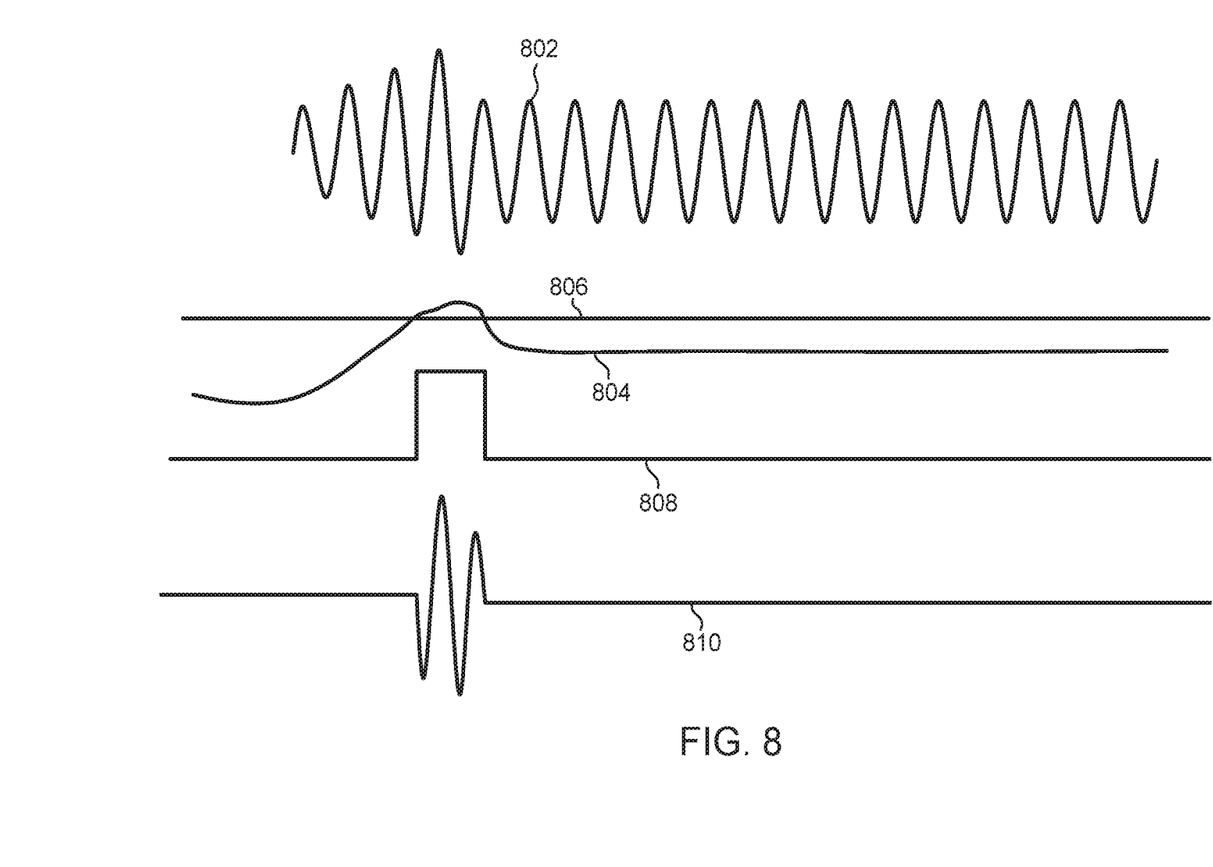
FIG. 8 illustrates a series of waveforms indicative of operation of an RF power supply, a gas conduit, and the plasma ignition circuit.

FIG. 8 illustrates a series of waveforms 802-810 indicative of operation of the RF power supply 121, the gas conduit 202, and the plasma ignition circuit 126 of the present disclosure. The first waveform 802 shows the combined RF voltage applied over time provided by the plasma ignition circuit 126 and the first secondary coil, wherein the plasma 116 is successfully ignited. The second waveform 804 shows the monitored second secondary RF voltage with the third waveform 806 corresponding to the threshold voltage level superimposed on the second waveform 804. The fourth waveform 808 shows the switch enable control signal output by the switch enable circuit 508. The fifth waveform 810 shows the second secondary RF voltage pulse applied capacitively by the plasma ignition circuit 126 to the excitation RF transformer 303 that coincides with the switch enable control signal output of the fourth waveform 808.

Figure 9A:
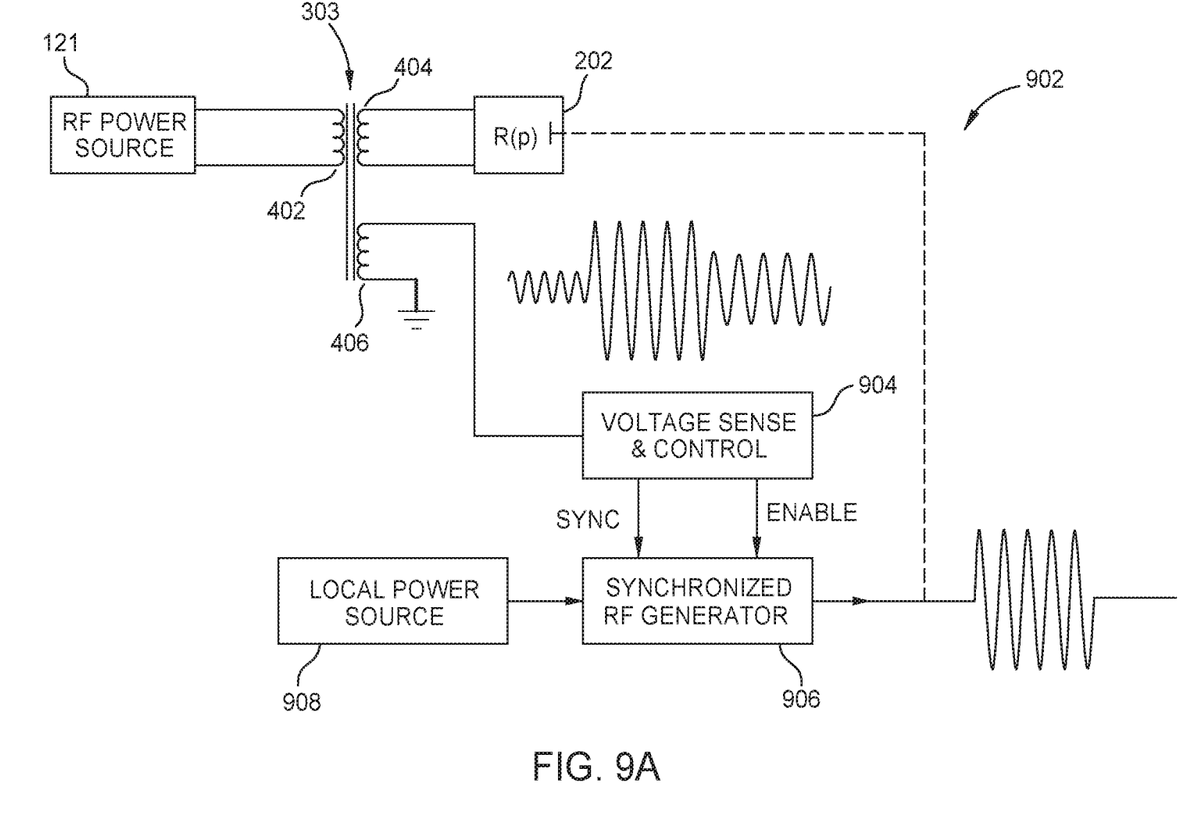
FIG. 9A is an electrical block diagram of a second embodiment of a plasma ignition circuit.

FIG. 9A is an electrical block diagram showing a second embodiment of a plasma ignition circuit 902. The plasma ignition circuit 902 includes a transformer 303 having a primary coil 402 configured to couple a primary RF power supply 121, a first secondary coil 404 configured to couple a remote plasma source (RPS) 120, and a second secondary coil 406. An RF source control circuit 904 is coupled to a low power RF source 906 powered by a low power DC voltage source 908. Power sources 906, 908 replace the control switch 308. As with the first embodiment of the plasma ignition circuit 126 shown in FIG. 4, a second secondary RF voltage is applied by the second secondary coil 406 to the RF source control circuit 904. The RF source control circuit 904 divides down the second secondary RF voltage to produce a low voltage envelope. This low voltage envelope provides a synchronization signal SYNC to a low power RF source 906. The SYNC signal causes a phase of a sinusoidal ignition pulse produced by the low power RF source 906 to be aligned with a phase of a primary RF output voltage delivered by the primary RF power supply 121. The low voltage envelope is compared to a threshold voltage level in the RF source control circuit 904. When the low voltage envelope is greater than a threshold, the low power RF source 906 is enabled (by an ENABLE signal from the RF source control circuit 904) to apply the ignition pulse 910 to the gases within the gas conduit 202. Accordingly, the combined RF voltage drops when plasma 116 is ignited, sensed voltage drops, and the low power RF source 906 is disabled.

Figure 9B:
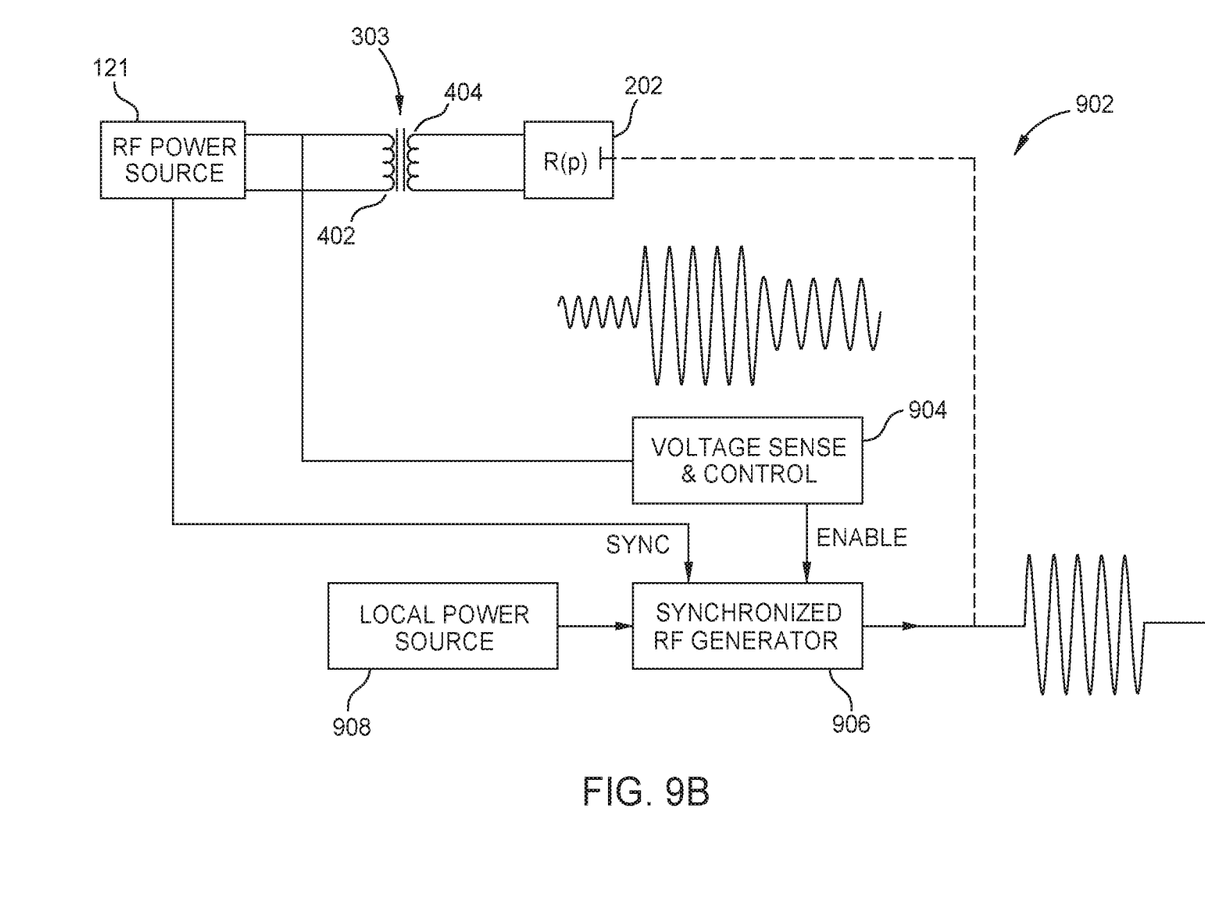
FIG. 9B is an electrical block diagram of a third embodiment of a plasma ignition circuit.

FIG. 9B is an electrical block diagram showing a third embodiment of a plasma ignition circuit 902. A primary RF power supply 121 having a primary RF output voltage couples the primary RF output voltage to a primary coil 402 of transformer 303. A first secondary coil 404 is configured to couple a portion of the primary RF output voltage to a remote plasma source (RPS) 120. The plasma ignition circuit 902 further includes an RF source control circuit 904 coupled to an RF generator 906 powered by a low power DC or AC voltage source 908. Power sources 906, 908 replace the control switch 308. The primary RF output voltage of the primary RF power supply 121 is applied to the primary coil 402, which inductively couples a first secondary RF voltage to the first second secondary coil 404. The first secondary RF voltage is, in turn, applied to the gas conduit 202 of the RPS 120 to aid in igniting and maintaining a plasma R(p). The primary RF output voltage is further applied to the RF source control circuit 904. The RF source control circuit 904 divides down the primary RF output voltage to produce a low voltage envelope. The RF source control circuit 904 further divides down the primary RF power supply voltage to produce a synchronization signal (SYNC). The SYNC signal causes a phase of a sinusoidal ignition pulse produced by the low power RF source 906 to be aligned with a phase of a primary RF output voltage delivered by the primary RF power supply 121. The primary RF power supply 121 further applies the synchronization signal (SYNC) to the RF generator 906. The low voltage envelope is compared to a threshold voltage level. When the low voltage envelope is greater than a threshold voltage level, the RF generator 906 is enabled (by an ENABLE signal of the RF source control circuit 9004) to apply the ignition pulse 910 to the gases within the gas conduit 202 of the RPS 120. Accordingly, the combined RF voltage drops when plasma 116 is ignited, the sensed voltage envelope drops in magnitude below the threshold voltage level, and the RF generator 906 is disabled to discontinue applying the ignition pulse 910.

What is claimed is:

1. A plasma ignition circuit comprising:
    a transformer having a primary coil configured to couple to an RF power supply, a first secondary coil configured to couple to a remote plasma source (RPS), and a second secondary coil;
    a control switch having an input configured to couple the second secondary coil and an output configured to capacitively couple to the RPS; and
    a switch controller configured to:
        upon sensing a secondary RF voltage applied to the second secondary coil in response to an RF voltage applied by RF power supply to the primary coil, enable the control switch to capacitively apply the secondary RF voltage to the RPS to ignite a plasma within the RPS, and
        upon sensing a drop in plasma impedance when the plasma is ignited, disable the control switch to discontinue applying the secondary RF voltage to the RPS.

2. The plasma ignition circuit of claim 1, wherein the switch controller is configured to sense the drop in plasma impedance by sensing a drop in the applied secondary RF voltage.

3. The plasma ignition circuit of claim 1, wherein the RPS comprises:
    a hollow gas conduit having an input port and an output port, the input port configured to receive gases to be ignited into the plasma within the hollow gas conduit, the plasma configured to exit the output port; and
    a core element having a body having an aperture, the primary coil of the transformer comprising a first plurality of windings wound about a central section of the body, the first secondary coil of the transformer comprising a second plurality of windings wound about the central section, the second secondary coil comprising a third plurality of windings wound about the central section and configured to be connected to ground potential, and the hollow gas conduit extending through the aperture.

4. The plasma ignition circuit of claim 3, wherein the hollow gas conduit has a pair of insulative spacers spacing a central section from an upper section and a lower section, wherein the central section is electrically isolated from the upper section and the lower section, the central section configured to be capacitively coupled to the control switch.

5. The plasma ignition circuit of claim 1, wherein the control switch is a solid state switch.

6. The plasma ignition circuit of claim 5, wherein the solid state switch is one or more of insulated-gate bipolar transistors (IGBT).

7. The plasma ignition circuit of claim 6, wherein a first IGBT of the one or more of IGBTs has a gate terminal configured to be coupled to an output of the switch controller, wherein the switch controller is configured to apply a signal to the gate terminal to enable the first IGBT.

8. The plasma ignition circuit of claim 1, wherein the switch controller comprises:
    a voltage divider configured to divide the secondary RF voltage to a reduced voltage;
    a threshold level circuit configured to output a threshold level voltage indicative of a voltage level needed to ignite the plasma;
    a comparator for comparing the reduced voltage to the threshold level voltage; and
    a switch enable circuit coupled to an output of the comparator and configured to enable the control switch.

9. The plasma ignition circuit of claim 8,
    wherein when the reduced voltage is greater than the threshold level voltage, the switch enable circuit enables the control switch, and
    wherein when reduced voltage is lower than the threshold level voltage indicative of the ignition of the plasma, the switch enable circuit disables the control switch.

10. The plasma ignition circuit of claim 8, wherein the switch enable circuit comprises:
    a voltage-controlled square wave generator that is enabled when the reduced voltage is greater than the threshold level voltage;

a transformer having a primary coil and a secondary coil, the primary coil coupled to an output of the square wave generator;

a rectifier for converting a square wave output by the square wave generator to a DC voltage level and to apply the DC voltage level to the control switch to enable the control switch.

11. A processing chamber, comprising:

a chamber body having an internal volume;

a remote plasma source (RPS) having an inlet and an outlet, the outlet fluidly coupled to the internal volume of the chamber body; and a plasma ignition circuit coupled to the RPS, the plasma ignition circuit comprising:

a transformer having a primary coil configured to couple an RF power supply, a first secondary coil configured to couple the RPS and a second secondary coil;

a control switch having an input configured to couple the second secondary coil and an output configured to capacitively couple the RPS; and a switch controller configured to:

upon sensing a secondary RF voltage applied to the second secondary coil in response to an RF voltage applied by RF power supply to the primary coil, enable the control switch to capacitively apply the secondary RF voltage to the RPS to ignite a plasma within the RPS, and upon sensing a drop in plasma impedance when the plasma is ignited, disable the control switch to discontinue applying the secondary RF voltage to the RPS.

12. The processing chamber of claim 11, wherein the switch controller is configured to sense the drop in plasma impedance by sensing a drop in the applied secondary RF voltage.

13. The processing chamber of claim 11, wherein the RPS comprises:

a hollow gas conduit having an input port and an output port, the input port configured to receive gases to be ignited into the plasma within the hollow gas conduit, the plasma configured to exit the output port; and a core element having a body having an aperture, the primary coil of the transformer comprising a first plurality of windings wound about a central section of the body, the first secondary coil of the transformer comprising a second plurality of windings wound about the central section, the second secondary coil comprising a third plurality of windings wound about the central section and configured to be connected to ground potential, and the hollow gas conduit extending through the aperture.

14. The processing chamber of claim 13, wherein the hollow gas conduit has a pair of insulative spacers spacing a central section from an upper section and a lower section, wherein the central section is electrically isolated from the upper section and the lower section, the central section configured to be capacitively coupled to the control switch.

15. The processing chamber of claim 11, wherein the control switch is one or more of insulated-gate bipolar transistors (IGBT).

16. The processing chamber of claim 14, wherein a first IGBT of the one or more of IGBTs has a gate terminal configured to be coupled to an output of the switch controller, wherein the switch controller is configured to apply a signal to the gate terminal to enable the first IGBT.

17. The processing chamber of claim 11, wherein the switch controller comprises:

a voltage divider configured to divide the secondary RF voltage to a reduced voltage;

a comparator for comparing the reduced voltage to a threshold level voltage; and a switch enable circuit coupled to an output of the comparator and configured to enable the control switch when the reduced voltage exceeds the threshold level voltage as indicated by a change of state of the comparator.

18. A method for igniting a plasma, comprising:

providing a primary RF power supply having a primary RF output voltage configured to be inductively coupled to a remote plasma source (RPS);

providing an RF generator having an output configured to couple to the RPS; and providing an RF source control circuit having an input and an output, the input of the RF source control circuit coupled to the primary RF power supply, the output of the RF source control circuit coupled to the RF generator, the RF source control circuit configured to:

enable the RF generator to apply an ignition pulse to the RPS to ignite the plasma within the RPS upon sensing the primary RF output voltage exceeding a threshold voltage; and disable the RF generator to discontinue applying the ignition pulse to the RPS upon sensing a drop in plasma impedance when the plasma is ignited.

19. The method of claim 18 wherein the RF source control circuit is further configured to:

divide down the primary RF output voltage to produce a low voltage envelope;

convert the low voltage envelope to an enable/disable signal; and apply the enable/disable signal to the RF generator, wherein, when the low voltage envelope is greater than a threshold, the RF generator is enabled to apply the ignition pulse, and when the low voltage envelope is less than or equal to the threshold, the RF generator is disabled from applying the ignition pulse.

20. The method of claim 18 wherein the primary RF power supply is further configured to:

divide down the primary RF output voltage to produce a synchronization signal; and apply the synchronization signal to the RF generator to synchronize the RF generator to the primary RF power source.

* * * * *